(12) United States Patent
Lin et al.

(10) Patent No.: US 12,221,536 B2
(45) Date of Patent: Feb. 11, 2025

(54) INSULATING FILM, METAL-CLAD LAMINATE MEMBER, AND REWIRING LAYER

(71) Applicant: Panasonic Intellectual Property Management Co., Ltd., Osaka (JP)

(72) Inventors: Cheng Ping Lin, Kyoto (JP); Toshiyuki Makita, Mie (JP); Naohito Fukuya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 233 days.

(21) Appl. No.: 17/921,263

(22) PCT Filed: Mar. 25, 2021

(86) PCT No.: PCT/JP2021/012558
§ 371 (c)(1),
(2) Date: Oct. 25, 2022

(87) PCT Pub. No.: WO2021/220684
PCT Pub. Date: Nov. 4, 2021

(65) Prior Publication Data
US 2023/0174772 A1 Jun. 8, 2023

(30) Foreign Application Priority Data
Apr. 27, 2020 (JP) .................................. 2020-078600

(51) Int. Cl.
*H05K 1/03* (2006.01)
*B32B 15/092* (2006.01)
(Continued)

(52) U.S. Cl.
CPC ............ *C08L 63/00* (2013.01); *B32B 15/092* (2013.01); *B32B 15/098* (2013.01); *B32B 27/20* (2013.01);
(Continued)

(58) Field of Classification Search
CPC ........................... H05K 1/0353; H05K 1/0373
See application file for complete search history.

(56) References Cited

U.S. PATENT DOCUMENTS

| | | | |
|---|---|---|---|
| 2016/0366761 A1* | 12/2016 | Hoshi | ................... H05K 1/0373 |
| 2018/0247834 A1* | 8/2018 | Tsuda | ..................... H01L 23/295 |
| 2019/0263087 A1 | 8/2019 | Kashihara et al. | |

FOREIGN PATENT DOCUMENTS

| | | |
|---|---|---|
| JP | 2010-053334 A | 3/2010 |
| JP | 2017-204527 A | 11/2017 |
| WO | WO 2018/021113 A1 | 2/2018 |

OTHER PUBLICATIONS

ISR for PCT/JP2021/012558, dated Jun. 15, 2021, (w/ translation).

* cited by examiner

*Primary Examiner* — Jeremy C Norris
(74) *Attorney, Agent, or Firm* — GREENBLUM & BERNSTEIN, P.L.C.

(57) ABSTRACT

A component (A1) thereof includes an epoxy resin having at least one of a naphthalene skeleton or a biphenyl skeleton. A component (A2) thereof includes a phenolic resin having at least one of the naphthalene skeleton or the biphenyl skeleton. A component (B) thereof includes a high molecular weight substance having structures expressed by at least formulae (b2) and (b3) out of formulae (b1), (b2), and (b3) and having a weight average molecular weight equal to or greater than 200,000 and equal to or less than 850,000. A component (C1) thereof includes a first filler obtained by subjecting a first inorganic filler to surface treatment using (Continued)

a first silane coupling agent expressed by formula (c1). A component (C2) thereof includes a second filler obtained by subjecting a second inorganic filler to surface treatment using a second silane coupling agent expressed by formula (c2).

13 Claims, 6 Drawing Sheets (51) Int. Cl.
  *B32B 15/098* (2006.01)
  *B32B 27/20* (2006.01)
  *B32B 27/38* (2006.01)
  *B32B 27/42* (2006.01)
  *C08J 5/18* (2006.01)
  *C08L 63/00* (2006.01)
  *B32B 15/20* (2006.01)

(52) U.S. Cl.
  CPC .............. *B32B 27/38* (2013.01); *B32B 27/42* (2013.01); *C08J 5/18* (2013.01); *H05K 1/0373* (2013.01); *B32B 15/20* (2013.01); *B32B 2264/1021* (2020.08); *B32B 2264/303* (2020.08); *B32B 2270/00* (2013.01); *B32B 2307/54* (2013.01); *B32B 2307/732* (2013.01); *B32B 2457/08* (2013.01); *C08J 2433/08* (2013.01); *C08J 2471/10* (2013.01); *C08L 2201/02* (2013.01); *C08L 2203/202* (2013.01); *C08L 2205/03* (2013.01)

INSULATING FILM, METAL-CLAD LAMINATE MEMBER, AND REWIRING LAYER

This application is the U.S. National Stage entry of PCT/JP2021/012558, filed Mar. 25, 2021, which claims priority to JP Application No. 2020-078600, filed Apr. 27, 2020, the disclosure of which is expressly incorporated by reference herein in its entirety.

TECHNICAL FIELD

The present disclosure generally relates to an insulating film, a metal-clad laminate member, and a rewiring layer. More particularly, the present disclosure relates to an insulating film including a semi-cured product of a resin composition, a metal-clad laminate member, and a rewiring layer.

BACKGROUND ART

Patent Literature 1 discloses a wiring circuit board. This wiring circuit board includes a glass substrate having a feedthrough electrode inside. On each of the two surfaces of the glass substrate, formed is a wiring layer as a first layer. The feedthrough electrode has a metallic material provided on an inner wall of the through hole provided through the glass substrate. Also, the wiring layer as the first layer is embedded in a recess provided in a region including an opening of the through hole and is connected to the feedthrough electrode. In addition, the respective inner walls of the recess and the through hole each have microscopic unevenness. A peripheral region surrounding the opening of the through hole has a curved surface shape and the inside diameter of the peripheral region gradually increases outward with respect to the through hole.

Such a wiring circuit board enables significantly increasing the degree of close contact between the recesses on both surfaces of the glass substrate and the wiring layer as the first layer and reducing the concentration of stress toward the feedthrough electrode, thus improving the reliability of connection.

On a wiring circuit board such as the one disclosed in Patent Literature 1, mounted are semiconductor components, electronic components, and other components. As there have been growing demands for further increasing the operating speeds, and further reducing the thicknesses, of those semiconductor components, electronic components, and other components, it has become increasingly important to further reduce the diameter of via (holes) of the wiring circuit board and the width of the rewiring.

Nevertheless, if the insulating layer is rather thick or has a significant surface roughness, then it is difficult to further reduce the diameter of via (holes) and the width of the rewiring. In other words, it is difficult to further increase the precision of the manufacturing process in that case, which is a problem with the known art.

CITATION LIST

Patent Literature

Patent Literature 1: JP 2017-204527 A

SUMMARY OF INVENTION

An object of the present disclosure is to provide an insulating film that makes it easier to further reduce the diameter of via (holes) and the width of the rewiring.

Another object of the present disclosure is to provide a metal-clad laminate member and a rewiring layer, each of which uses such an insulating film.

An insulating film according to an aspect of the present disclosure is an insulating film including a semi-cured product of a resin composition. The resin composition contains: at least one of a component (A1) or a component (A2); a component (B); a component (C1); and a component (C2). The component (A1) includes an epoxy resin having at least one of a naphthalene skeleton or a biphenyl skeleton. The component (A2) includes a phenolic resin having at least one of the naphthalene skeleton or the biphenyl skeleton. The component (B) includes a high molecular weight substance having structures expressed by at least the following formulae (b2) and (b3) out of the following formulae (b1), (b2), and (b3) and having a weight average molecular weight equal to or greater than 200,000 and equal to or less than 850,000. The component (C1) includes a first filler obtained by subjecting a first inorganic filler to surface treatment using a first silane coupling agent expressed by the following formula (c1). The component (C2) includes a second filler obtained by subjecting a second inorganic filler to surface treatment using a second silane coupling agent expressed by the following formula (c2). The insulating film contains an inorganic filler having a maximum particle size equal to or less than 5 μm.

where x in the formula (b1), y in the formula (b2), and z in the formula (b3) satisfy the following relational expression: x:y:z (in mole fractions)=0:0.95:0.05 to 0.2:0.6:0.2 (where x+y+z≤1, 0≤x≤0.2, 0.6≤y≤0.95, and 0.05≤z≤0.2); in the formula (b2), R1 is either a hydrogen atom or a methyl group, R2 is selected from the group consisting of a hydrogen atom, an alkyl group, a glycidyl group, and an epoxidized alkyl group and at least includes either the glycidyl group or the epoxidized alkyl group; in the formula (b3), R3 is either a hydrogen atom or a methyl group and R4 is Ph (phenyl group), —COOCH$_2$Ph, or —COO(CH$_2$)$_2$Ph; in the formula (c1), R5 is either a methoxy group or an ethoxy group and R6 has an isocyanate group, a glycidyl group, or an amino group at an end of an aliphatic alkyl group having a carbon number equal to or greater than 3 and equal to or less than 18; and in the formula (c2), R7 is either a methoxy group or an ethoxy group and R8 has either a methacryloyl group or a vinyl group at an end of an aliphatic alkyl group having a carbon number equal to or greater than 3 and equal to or less than 18.

A metal-clad laminate member according to another aspect of the present disclosure includes: a semi-cured product of the insulating film described above; and a sheet of metal foil bonded to the semi-cured product.

A rewiring layer according to still another aspect of the present disclosure includes: a cured product of the insulating film described above; and a conductor pattern provided for the cured product.

DESCRIPTION OF EMBODIMENTS

[Insulating Film]

An insulating film according to an exemplary embodiment includes a semi-cured product of a resin composition. The semi-cured product of a resin composition herein refers to a resin composition in an intermediate stage of the curing reaction. The intermediate stage is also called "Stage B" and is a stage between a varnish-state stage (Stage A) and a completely cured-state stage (Stage C). If the semi-cured product of the resin composition in this stage is further heated, the semi-cured product melts once and then is cured fully to turn into a cured product of the resin composition. The insulating film according to this embodiment may be made of the resin composition in the semi-cured state. Also, the cured product of the insulating film herein means that the resin composition that forms the insulating film is in the fully cured state.

The insulating film according to this embodiment has electrical insulation properties. That is to say, the insulating film has the property of conducting electricity less smoothly than a semiconductor does. In addition, the insulating film is configured as a semi-cured product of the resin composition formed into a thin film. The insulating film may have a thickness equal to or greater than 0.1 μm and equal to or less than 10 μm. An insulating film according to this embodiment does not use any base member such as a nonwoven fabric of glass or a woven fabric of glass. That is to say, the insulating film according to this embodiment consists essentially of a semi-cured product of the resin composition, and therefore, may be thinner than an insulating film that uses a base member (i.e., a prepreg). This makes it easier to reduce the diameter of via (holes) and the width of the rewiring. The insulating film according to this embodiment preferably has a thickness equal to or greater than 0.3 μm and equal to or less than 7 μm.

Next, the resin composition will be described. The resin composition contains at least one of the following components (A1) and (A2). That is to say, the resin composition may contain both the components (A1) and (A2). Alternatively, the resin composition may contain only the component (A1) without the component (A2). Still alternatively, the resin composition may contain only the component (A2) without the component (A1). The resin composition further contains the following components (B), (C1), and (C2). These components that form the resin composition will now be described one by one.

The component (A1) will be described. The component (A1) is a matrix resin that is a high rigidity component. Specifically, the component (A1) is an epoxy resin having at least one of a naphthalene skeleton or a biphenyl skeleton. As can be seen, the epoxy resin as the component (A1) may have both the naphthalene skeleton and the biphenyl skeleton, may have only the naphthalene skeleton without the biphenyl skeleton, or may have only the biphenyl skeleton without the naphthalene skeleton. In the following description, an epoxy resin having the naphthalene skeleton without the biphenyl skeleton will be hereinafter sometimes referred to as a "naphthalene skeleton containing epoxy resin" and an epoxy resin having the biphenyl skeleton without the naphthalene skeleton will be hereinafter sometimes referred to as a "biphenyl skeleton containing epoxy resin."

The component (A2) will be described. The component (A2) is also a matrix resin that is a high rigidity component. Specifically, the component (A2) is a phenolic resin having at least one of the naphthalene skeleton or the biphenyl skeleton. As can be seen, the phenolic resin as the component (A2) may have both the naphthalene skeleton and the biphenyl skeleton, may have only the naphthalene skeleton without the biphenyl skeleton, or may have only the biphenyl skeleton without the naphthalene skeleton. In the following description, a phenolic resin having the naphthalene skeleton without the biphenyl skeleton will be hereinafter sometimes referred to as a "naphthalene skeleton containing phenolic resin" and a phenolic resin having the biphenyl skeleton without the naphthalene skeleton will be hereinafter sometimes referred to as a "biphenyl skeleton containing phenolic resin."

As can be seen, both the components (A1) and (A2) have at least one of the naphthalene skeleton or the biphenyl skeleton, thus improving the heat resistance (such as solder heat resistance) of the insulating film. Among other things, the naphthalene skeleton is a rigid skeleton. Thus, when at least one of the component (A1) or the component (A2) has the naphthalene skeleton, the heat resistance of the cured product of the insulating film is further improvable. The insulating film may be a material for metal-clad laminates, printed wiring boards, and semiconductor packages, for example, thus enabling improving the heat resistance of metal-clad laminates, printed wiring boards, and semiconductor packages as well. Note that the metal-clad laminate and the printed wiring board will be hereinafter sometimes collectively referred to "boards."

Next, the component (B) will be described. The component (B) is a low elasticity component and may be an epoxy-modified acrylic resin, for example. Specifically, the component (B) has structures expressed by at least the formulae (b2) and (b3), respectively, among the formulae (b1), (b2), and (b3). In these chemical formulae, x in the formula (b1), y in the formula (b2), and z in the formula (b3) satisfy the following relational expression: x:y:z (in mole fractions)=0:0.95:0.05 to 0.2:0.6:0.2 (where x+y+z≤1, 0≤x≤0.2, 0.6≤y≤0.95, and 0.05≤z≤0.2). In the formula (b2), R1 is either a hydrogen atom or a methyl group and R2 is selected from the group consisting of a hydrogen atom, an alkyl group, a glycidyl group, and an epoxidized alkyl group and at least includes either the glycidyl group or the epoxidized alkyl group. In the formula (b3), R3 is either a hydrogen atom or a methyl group, and R4 is Ph (a phenyl group), —COOCH$_2$Ph, or —COO(CH$_2$)$_2$Ph.

That is to say, the main chain of the component (B) has structures expressed by at least the formulae (b2) and (b3), respectively, out of the formulae (b1), (b2), and (b3). If the main chain of the component (B) has structures expressed by the formulae (b1), (b2) and (b3), respectively, the order of arrangement of the respective structures expressed by the formulae (b1), (b2), and (b3) is not limited to any particular one. In that case, in the main chain of the component (B), the structures expressed by the formula (b1) may or may not be continuous with each other, the structures expressed by the formula (b2) may or may not be continuous with each other, and the structures expressed by the formula (b3) may or may not be continuous with each other.

If the main chain of the component (B) has structures expressed by the formulae (b2) and (b3), respectively, the order of arrangement of the respective structures expressed by the formulae (b2) and (b3) is not limited to any particular one. In that case, in the main chain of the component (B), the structures expressed by the formula (b2) may or may not be continuous with each other, and the structures expressed by the formula (b3) may or may not be continuous with each other.

The significance of R2 in the formula (b2) at least including either a glycidyl group or an epoxidized alkyl group among a hydrogen atom, an alkyl group, the glycidyl group, and the epoxidized alkyl group will be described as a supplement. The premise is that R2 in the structure expressed by a single formula (b2) is a single ingredient. In the following description, a situation where the component (B) has only one structure expressed by the formula (b2) and a situation where the component (B) has two or more structures expressed by the formula (b2) will be described separately.

In the former case, i.e., if the component (B) has a single structure expressed by the formula (b2), R2 is either the glycidyl group or the epoxidized alkyl group.

In the latter case, i.e., if the component (B) has two or more structures expressed by the formula (b2), then R2 in at least one structure expressed by the formula (b2) is either a glycidyl group or an epoxidized alkyl group, while R2 in the other structures expressed by the formula (b2) is either a hydrogen atom or an alkyl group. Since R2 in the at least one structure expressed by the formula (b2) is either the glycidyl group or the epoxidized alkyl group, R2 in every structure expressed by the formula (b2) may also be either the glycidyl group or the epoxidized alkyl group.

The structure expressed by the formula (b3) includes Ph (a phenyl group), —COOCH$_2$Ph, and —COO(CH$_2$)$_2$Ph. Ph, —COOCH$_2$Ph, and —COO(CH$_2$)$_2$Ph are thermally stable enough to increase the strength of a cured product of the insulating film. This increases the moisture-heat resistance of the board fabricated using the insulating film as a material.

The component (B) preferably has no unsaturated bonds, such as double bonds or triple bonds, between adjacent carbon atoms. That is to say, in the component (B), adjacent carbon atoms are preferably bonded together with a saturated bond (single bond). This reduces oxidation with time, thus reducing an increase in brittleness due to the loss of elasticity.

The component (B) is a high molecular weight substance with a weight average molecular weight (Mw) falling within the range from 200,000 to 850,000. The number of significant digits of the weight average molecular weight is two. That is to say, a numerical value to be 200,000 or 850,000 when rounded to the third place (i.e., the thousand place) also falls within the range from 200,000 to 850,000. If the weight average molecular weight of the component (B) is less than 200,000, then the chemical resistance of the cured product could decrease. Also, if the weight average molecular weight of the component (B) is greater than 850,000, then the moldability of the resin composition could decrease. The weight average molecular weight (Mw) of the component (B) preferably falls within the range from 300,000 to 500,000.

Adding the component (B) to the resin composition decreases the moisture absorption of the cured product of the insulating film, thus increasing the moisture resistance of the board and eventually improving the insulation reliability. In addition, even if the cured product of the insulating film absorbs moisture, the moisture-heat resistance of the board is still improvable, because the breaking strength of the resin that forms part of the cured product has been increased. Particularly, even in a relatively thick printed wiring board, of which the insulating layer has a thickness equal to or greater than 0.2 mm, the swell of the insulating layer under the heat generated by soldering is still reducible because the moisture-heat resistance has been increased. Naturally, the moisture-heat resistance has also been increased even in a relatively thin printed wiring board, of which the insulating layer has a thickness less than 0.2 mm.

In this embodiment, the components (A1) and (A2) and the component (B) are preferably in a phase separation state, instead of exhibiting compatibility, when the resin composition is semi-cured or cured. This checks a decrease in the glass transition temperature (Tg) of a cured product of the insulating film, thus increasing the heat resistance (e.g., solder heat resistance) of the board and the package.

The epoxy value of the component (B) preferably falls within the range from 0.01 eq/kg to 0.80 eq/kg. As used herein, the "epoxy value" refers to the number of equivalents of the epoxy group in 1 kg of the component (B). The component (B) having an epoxy value falling within this range makes the components (A1) and (A2) less easily compatible with the component (B). This checks a decrease in the glass transition temperature (Tg) of a cured product of the insulating film and increases the heat resistance of the board and the package. The epoxy value of the component (B) more preferably falls within the range from 0.06 eq/kg to 0.40 eq/kg and even more preferably falls within the range from 0.14 eq/kg to 0.28 eq/kg.

The component (C1) will be described. The component (C1) is a first filler obtained by subjecting a first inorganic filler to surface treatment using a first silane coupling agent expressed by the formula (c1). That is to say, the first inorganic filler is an aggregate of fine particles. On the surface of those fine particles, the first silane coupling agent expressed by the formula (c1) is bonded chemically with their reaction group (which is silanol produced by hydrolysis of a methoxy group or an ethoxy group). The first filler as the component (C1) is formed in this manner. In the formula (c1), R5 is either a methoxy group or an ethoxy group, and R6 has an isocyanate group, a glycidyl group, or an amino group at an end of an aliphatic alkyl group having a carbon number equal to or greater than 3 and equal to or less than 18.

Specific examples of the first inorganic fillers include spherical silica, barium sulfate, silicon oxide powder, crushed silica, calcined talc, barium titanate, titanium oxide, clay, alumina, mica, boehmite, zinc borate, zinc stannate, and other metal oxides and metal hydrates.

In this embodiment, the resin composition contains an inorganic filler, of which the maximum particle size is equal to or less than 5 μm. In other words, the resin composition preferably contains no inorganic filler having a particle size greater than 5 μm. In this case, the first inorganic filler may be such an inorganic filler, of which the maximum particle size is equal to or less than 5 μm. Likewise, the second inorganic filler to be described later may also be such an inorganic filler, of which the maximum particle size is equal to or less than 5 μm. Furthermore, if the resin composition contains any additional inorganic filler other than the first inorganic filler and the second inorganic filler, then the additional inorganic filler preferably also has a maximum particle size equal to or less than 5 μm. If the resin composition contains any inorganic filler having a particle size greater than 5 μm, then the insulation reliability of a relatively thin material (such as an insulating film, a metal-clad laminate, or a printed wiring board) would decline. In addition, this would also make it more difficult to reduce the thickness of the insulating film, reduce the surface roughness of the insulating film, and reduce the diameter of via (holes) and the width of rewiring. Note that the mean particle size as used herein refers to a particle size at an integrated value of 50% in a particle size distribution obtained by laser diffraction and scattering method.

The first silane coupling agent expressed by the formula (c1) is trifunctional alkoxy silane in which an aliphatic alkyl group, having a particular carbon number and including a particular functional group (which may be an isocyanate group, a glycidyl group, or an amino group) at an end, is bonded to a silicon atom.

Specific examples of the silane coupling agent including an isocyanate group at the end of the aliphatic alkyl group include 3-isocyanatepropyltriethoxy silane.

Specific examples of the silane coupling agent including a glycidyl group at the end of the aliphatic alkyl group include 3-glycidoxypropyltrimethoxy silane, 3-glycidoxypropyltriethoxy silane, and 3-glycidoxyoctyltrimethoxy silane.

Specific examples of the silane coupling agent including an amino group at the end of the aliphatic alkyl group include N-2-(aminoethyl)-3-aminopropyltrimethoxy silane, 3-amino-propyltrimethoxy silane, 3-aminopropyltriethoxy silane, and N-phenyl-3-aminopropyltrimethoxy silane.

When the first inorganic filler is subjected to surface treatment using the first silane coupling agent expressed by the formula (c1), the aliphatic alkyl group having the particular carbon number will be present on the surface of the first filler. To the end of this aliphatic alkyl group, bonded is an isocyanate group, a glycidyl group, or an amino group. These reaction groups have high affinity with the epoxy resin as the component (A1) and the phenolic resin as the component (A2). Therefore, these reaction groups cause the first filler as the component (C1), the epoxy resin as the component (A1), and the phenolic resin as the component (A2) to be chemically bonded with each other. Note that the component (B) is epoxy modified (see the formula (b2)) but has low affinity with the component (C1) because its amount is small. Therefore, when the resin composition is semi-cured or cured, the components (A1) and (A2) and the component (B) tend to have a phase-separated structure without exhibiting compatibility.

The aliphatic alkyl group of the reaction group R6 in the first silane coupling agent expressed by the formula (c1) has a carbon number equal to or greater than 3 and equal to or less than 18. If the carbon number of the aliphatic alkyl group were less than three, then the cured product of the insulating film would have excessive elasticity.

The component (C2) will be described. The component (C2) is a second filler obtained by subjecting the second inorganic filler to surface treatment using a second silane coupling agent expressed by the formula (c2). That is to say, the second inorganic filler is an aggregate of fine particles. Onto the surface of those fine particles, the second silane coupling agent expressed by the formula (c2) is bonded chemically with its reaction group (which is either a methoxy group or an ethoxy group). The second filler as the component (C2) is formed in this manner. In the formula (c2), R7 is either a methoxy group or an ethoxy group, and R8 has a methacryloyl group or a vinyl group at an end of an aliphatic alkyl group having a carbon number equal to or greater than 3 and equal to or less than 18.

Specific examples of the second inorganic filler may be the same as those of the component (C1), i.e., may be the same as specific examples of the first inorganic filler. The first inorganic filler of the component (C1) and the second inorganic filler of the component (C2) may have either the same material and same mean particle size or different materials and different mean particle sizes, whichever is appropriate.

The second silane coupling agent expressed by the formula (c2) is trifunctional alkoxy silane in which an aliphatic alkyl group, having a particular carbon number and including a particular functional group (which may be either a methacryloyl group or a vinyl group) at an end, is bonded to a silicon atom. Note that the methacryloyl group is trivially called a "methacrylic group."

Specific examples of the silane coupling agent including a methacryloyl group at the end of the aliphatic alkyl group include 3-methacryloxypropyltrimethoxy silane, 3-methacryloxy-propyltriethoxy silane, and 3-methacryloxyoctyltrimethoxy silane.

Specific examples of the silane coupling agent including a vinyl group at the end of an aliphatic alkyl group include vinyltrimethoxysilane and vinyltriethoxysilane.

When the second inorganic filler is subjected to surface treatment using the second silane coupling agent expressed by the formula (c2), the aliphatic alkyl group having the particular carbon number will be present on the surface of the second filler. To the end of this aliphatic alkyl group, bonded is either a methacryloyl group or a vinyl group. These reaction groups have high affinity with the component (B). Therefore, these reaction groups cause the second filler as the component (C2) and component (B) to be chemically bonded together.

The aliphatic alkyl group of the reaction group R8 in the second silane coupling agent expressed by the formula (c2) has a carbon number equal to or greater than 3 and equal to or less than 18. If the carbon number of the aliphatic alkyl group were less than three, then the cured product of the insulating film would have excessive elasticity.

Generally speaking, in a cured product of a resin composition containing a resin and an inorganic filler, the resin tends to absorb more moisture than the inorganic filler does. Therefore, if the inorganic filler is dispersed non-uniformly in the cured product of the resin composition, then a lot of resin will be present in a portion where the inorganic filler is sparse, thus absorbing a lot of water there. On the other hand, plenty of resin will not be present in a portion where the inorganic filler is dense, thus absorbing less water. That is to say, non-uniform dispersion of the inorganic filler makes the dispersion of water to absorb non-uniform as well. When a cured product of such a resin composition is subjected to a moisture/heat resistance test, the result will be that water will be present non-uniformly and the localized water will vaporize to cause swelling.

In contrast, according to this embodiment, adding both of the two types of fillers (i.e., the first filler and the second filler), obtained by subjecting the two types of inorganic fillers (i.e., the first inorganic filler and the second inorganic filler) to surface treatment using two types of silane coupling agents (i.e., the first silane coupling agent and the second silane coupling agent), improves the moisture-heat resistance for the following reason. Specifically, the first filler as the component (C1) has high affinity with the epoxy resin as the component (A1) and the phenolic resin as the component (A2), while the second filler as the component (C2) has high affinity with the component (B). This reduces the chances of the entire first filler as the component (C1) and the entire second filler as the component (C2) being localized around the components (A1) and (A2) or localized around the component (B). That is to say, this allows the entire first and second fillers to be distributed uniformly in the cured product of the resin composition, and therefore, allows water to be dispersed and absorbed uniformly as well. This reduces not only the localization of water but also the chances of causing swelling, thus improving the moisture-heat resistance.

In addition, adding the first filler as the component (C1) and the second filler as the component (C2) to the resin composition increases the dimensional stability of the board as well.

Next, a common feature of the first filler as the component (C1) and the second filler as the component (C2) will be described. In the following description, "fillers" without any modifier will hereinafter collectively refer to both of the first filler and the second filler. Likewise, "inorganic fillers" without any modifier will hereinafter collectively refer to both of the first inorganic filler and the second inorganic filler. Furthermore, "silane coupling agents" without any modifier will hereinafter collectively refer to both of the first silane coupling agent expressed by the formula (c1) and the second silane coupling agent expressed by the formula (c2).

The aliphatic alkyl group has the capability of relieving the stress caused by the cured insulating film during its thermal expansion or shrinkage. When the inorganic fillers are subjected to surface treatment using the silane coupling agents, a stress relieving layer produced from the aliphatic alkyl group will be formed on the surface of the inorganic fillers. Adding the fillers having the stress relieving layer to the components (A1), (A2), and (B) allows the stress caused to these components (A1), (A2), and (B) due to thermal expansion or shrinkage to be relieved. This reduces the chances of the cured insulating film containing the fillers being thermally deformed. Thus, the moisture-heat resistance of the board is further improvable. The presence of the aliphatic alkyl group on the surface of the fillers would relieve the stress for a couple of reasons. One reason is that the free rotational ability of the single bond of the alkyl group would allow the alkyl group of the filler to expand or shrink thermally, as the components (A1), (A2), and (B) expand or shrink thermally.

In addition, the aliphatic alkyl group also has the capability of reducing the etch depth for a desmear process (desmear etching process) to be performed after the metal-clad laminate, formed using the insulating film as a material, has been subjected to hole cutting.

As used herein, the desmear process refers to the process of removing resin smears, produced during the hole cutting process step by laser machining or drilling, by chemical hole cleaning, for example. A specific desmear process may be potassium permanganate treatment, for example. In the potassium permanganate treatment, a desmear liquid, including alkali potassium permanganate as a main component, is used.

The etch depth refers herein to the amount of the resin removed by the desmear process. An excessive etch depth could increase the diameter of a hole cut by the hole cutting process step. Thus, the etch depth is preferably as small as possible.

The presence of the aliphatic alkyl group on the surface of the fillers as described above reduces the permeation of the desmear liquid into the cured product of the resin composition, thus decreasing the etch depth. This enables reducing an increase in the inside diameter of the holes even when the desmear process is carried out.

The aliphatic alkyl group has, at the end thereof, an isocyanate group, a glycidyl group, an amino group, a methacryloyl group, or a vinyl group, and these functional groups are bonded strongly to the component (A1), (A2), or (B). This allows the etch depth to be reduced at the time of the desmear process, compared to a situation where none of these functional groups, namely, isocyanate group, glycidyl group, amino group, methacryloyl group, or vinyl group, is present at the end of the aliphatic alkyl group.

Examples of methods for subjecting the inorganic fillers to surface treatment using the silane coupling agents include a direct treatment method, an integral blending method, and a dry concentrate method. When the inorganic fillers are subjected to surface treatment with the silane coupling agents, the amount of the silane coupling agents added to the inorganic fillers is not limited to any particular value. The amount of the silane coupling agents to be added to form a single molecular layer of the silane coupling agents over the entire surface of the inorganic fillers may be calculated by the following equation (1). A preferred amount of the silane coupling agents to be added is 0.1 to 15 times as large as the value calculated by the following equation.

In that case, the inorganic fillers will relieve the stress even more efficiently.

$$WC = WF \times SF / SC \quad (1)$$

where WC is the amount (g) of the silane coupling agents to be added to form a single molecular layer, WF is the amount (g) of the inorganic fillers added, SF is the specific surface area ($m^2/g$) of the inorganic fillers, and SC is the minimum area ($m^2/g$) covered by the silane coupling agents.

Either the component (C1) or the component (C2) is preferably a nanofiller with a mean particle size equal to or less than 500 nm, and more preferably a nanofiller with a mean particle size equal to or greater than 10 nm and equal to or less than 500 nm. If either the component (C1) or the component (C2) has a mean particle size equal to or less than 500 nm, those resin smears are removable more effectively by the desmear process. This point will be described in further detail. The main component of the resin smears would be the component (B) that is a high molecular weight substance. If either the component (C1) or the component (C2) is the nanofiller described above (which will be hereinafter referred to as a "first situation"), the nanofiller will be dispersed uniformly in the resin smears. Such resin smears are easily removable by the desmear process. On the other hand, if neither the component (C1) nor the component (C2) is the nanofiller (which will be hereinafter referred to as a "second situation"), the resin smears will consist essentially of the resin component. Such resin smears are removable by tightening the condition of the desmear process compared to the first situation but are removable less easily when the desmear process is carried out under the same condition as in the first situation. That is to say, supposing the desmear process is carried out under the same condition, the resin smears are removable more easily in a situation where either the component (C1) or the component (C2) has a mean particle size equal to or less than 500 nm than in a situation where both the component (C1) and the component (C2) have a mean particle size greater than 500 nm. The reason is that the nanofiller with a mean particle size equal to or less than 500 nm would be dispersed uniformly in the resin smears as described above. Either the component (C1) or the component (C2) having a mean particle size equal to or greater than 10 nm would reduce the thickening of the resin composition in a varnish state. In the following description, the nanofiller without any modifier will hereinafter refer to either the first filler or second filler, whichever has a mean particle size equal to or less than 500 nm.

In the resin composition, the ratio (by mass) of the sum of the components (A1) and (A2) to the component (B) preferably falls within the range from 90:10 to 50:50 and more preferably falls within the range from 80:20 to 60:40. In other words, with respect to 100 parts by mass in total of the components (A1), (A2), and (B), the content of the component (B) preferably falls within the range from 10 parts by mass to 50 parts by mass, and more preferably falls within the range from 20 parts by mass to 40 parts by mass. The ratio of the hydroxyl equivalent of the phenolic resin as the component (A2) to one epoxy equivalent of the epoxy resin as the component (A1) preferably falls within the range from 0.2 to 1.1. The combined content of the components (C1) and (C2) is preferably equal to or less than 80% by mass, and more preferably equal to or less than 50% by mass, with respect to the entire mass of the resin composition. In that case, the combined content of the components (C1) and (C2) refers, when the components (C1) and (C2) are subjected to surface treatment using their respective predetermined silane coupling agents, to the combined content of the surface-treated components (C1) and (C2) including the silane coupling agents. The ratio (by mass) of the component (C1) to the component (C2) preferably falls within the range from 100:0 to 60:40, and more preferably falls within the range from 95:5 to 80:20. In other words, the content of the component (C2) with respect to 100 parts by mass in total of the components (C1) and (C2) preferably falls within the range from 0 parts by mass to 40 parts by mass, and more preferably falls within the range from 5 parts by mass to 20 parts by mass.

If either the component (C1) or the component (C2) is a nanofiller, then the content of the nanofiller preferably falls within the range from 1 part by mass to 30 parts by mass, and more preferably falls within the range from 3 parts by mass to 10 parts by mass, with respect to 100 parts by mass in total of the components (A1), (A2), and (B). Adding at least 1 part by mass of the nanofiller would enhance the effect of removing the resin smears by the desmear process. More specifically, supposing the desmear process is carried out under the same condition, the resin smears are removable more easily in a situation where the content of the nanofiller is equal to or greater than 1 part by mass than in a situation where the content of the nanofiller is less than 1 part by mass. As long as the content of the nanofiller is equal to or less than 30 parts by mass, thickening of the resin composition in the varnish state is reducible.

The resin composition may further contain some additive. Specific examples of the additives include a phosphorus-based flame retardant. Adding the phosphorus-based flame retardant to the resin composition would improve the flame retardancy of the cured product of the insulating film, the board, and the package. Note that even though the phosphorus-based flame retardant tends to absorb moisture, the moisture-heat resistance is still improvable because two types of fillers obtained by subjecting two types of inorganic fillers to surface treatment using two types of silane coupling agents are used in this embodiment. The phosphorus-based flame retardant hardly affects the dispersion of the inorganic fillers. When a small part (such as a package) is fabricated with the resin composition, there is little need to impart flame retardancy to that part. On the other hand, when a large part (such as a motherboard) is fabricated with the resin composition, there is much need to impart flame retardancy to the part. That is why in the latter case, the phosphorus-based flame retardant is preferably added to the resin composition.

Optionally, the resin composition may further contain a curing accelerator. Examples of the curing accelerators include imidazoles and derivatives thereof, organic phosphorus compounds, metal soaps such as zinc octoate, secondary amines, tertiary amines, and quaternary ammonium salts.

Next, the physical properties of the insulating film according to this embodiment will be described.

A loss tangent (tan δ) chart is obtained by dynamic mechanical analysis (DMA) of a cured product of the insulating film as a sample. This chart (tan δ curve) preferably has a peak in a temperature range equal to lower than 100° C. and another peak in a temperature range equal to or higher than 200° C., and more preferably has a peak in a temperature range equal to lower than 60° C. and another peak in a temperature range equal to or higher than 200° C. The peak in the temperature range equal to or higher than 200° C. is a primary dispersion peak. The primary dispersion peak is related to the main chain movement of the molecular structure of the cured product and is caused by the glass transition temperature (Tg). On the other hand, the peak in the temperature range equal to lower than 100° C. or in the temperature range equal to lower than 60° C. is an auxiliary dispersion peak. The auxiliary dispersion peak is related to the side chain movement of the molecular structure of the cured product and is caused by the component (B) that is a high molecular weight substance, among other things. Shifting the auxiliary dispersion peak from the temperature equal to lower than 100° C. to the temperature equal to lower than 60° C. (i.e., toward a range with lower temperatures) imparts a higher elongation characteristic and even lower elasticity to the cured product.

The dynamic mechanical analysis described above may be conducted with the frequency set at a constant value (of 10 Hz, for example). The loss tangent (tan δ) is the ratio of the loss modulus (E") to the storage modulus (E'). That is to say, the loss tangent (tan δ)=loss modulus (E")/storage modulus (E'). In a loss tangent (tan δ) chart, the ordinate thereof indicates the loss tangent (tan δ), and the abscissa thereof indicates the temperature to represent the temperature dependence of the loss tangent (tan δ).

In the cured state, the insulating film has a loss modulus (E") to storage modulus (E') ratio equal to or greater than 0.05 preferably in a temperature range equal to lower than 100° C. and a temperature range equal to or higher than 200° C., and more preferably in a temperature range equal to lower than 60° C. and the temperature range equal to or higher than 200° C. In particular, the peak value of the loss tangent (tan δ) of the insulating film is equal to or greater than 0.05 preferably in both the temperature range equal to lower than 100° C. and the temperature range equal to or higher than 200° C., and more preferably in both the temperature range equal to lower than 60° C. and the temperature range equal to or higher than 200° C.

The loss tangent (tan δ) chart having a peak equal to or greater than 0.05 in the temperature range equal to lower than 100° C. and another peak equal to or greater than 0.05 in the temperature range equal to or higher than 200° C. allows the insulating film to have features of both the components (A1) and (A2) that are high rigidity components and the component (B) that is a low elasticity component. In addition, shifting the auxiliary dispersion peak from the temperature equal to lower than 100° C. to the temperature equal to lower than 60° C. (i.e., toward a range with lower temperatures) as described above imparts a higher elongation characteristic and an even lower elasticity to the cured product.

The insulating film according to this embodiment may be produced by, for example, the following method. First, a varnish of the resin composition is prepared. The components (A1), (A2) and (B) are added to, and dissolved in, a solvent, and then compounded with an additive and a curing accelerator added thereto as needed, thereby preparing a base varnish. In this case, examples of solvents used for preparation include acetone, ketone solvents such as methyl ethyl ketone and cyclohexanone, aromatic solvents such as toluene and xylene, and nitrogen-containing solvents such as dimethyl formamide. Next, the components (C1) and (C2) are added to, and dispersed in, the base varnish, thereby preparing a resin composition varnish. The components (C1) and (C2) may be dispersed using a disperser such as a homogenizer, a disper, or a beads mill. Next, the resin composition in the varnish state (in Stage A) may be applied, for example, to form a film of the resin composition, which is then heated and dried to a semi-cured state (Stage B), thereby producing the insulating film.

[Metal-Clad Laminate Member]

Figure 1:
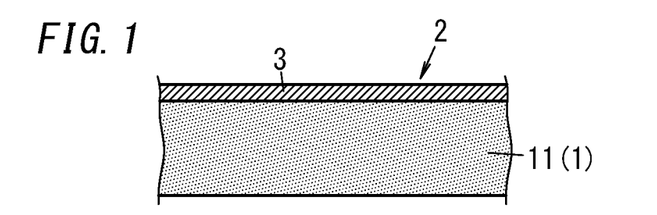
FIG. 1 is a cross-sectional view illustrating an embodiment of a metal-clad laminate member according to the present disclosure.

A metal-clad laminate member 2 according to this embodiment includes a semi-cured product 11 of an insulating film 1 and a sheet of metal foil 3 bonded to the semi-cured product 11 as shown in FIG. 1. That is to say, the metal-clad laminate member 2 is formed as either a sheet of metal foil with resin or a resin film with a sheet of metal foil. For example, if the insulating film 1 is made of a resin composition in a semi-cured state, the sheet of metal foil 3 is bonded to the surface of the insulating film 1. In that case, the sheet of metal foil 3 is bonded to either one side of a single insulating film 1 or each of the two sides of the insulating film 1. As the sheet of metal foil 3, a sheet of copper foil may be used, for example.

In the metal-clad laminate member 2 according to this embodiment, the insulating film 1 consists essentially of a semi-cured product of the resin composition without including any base member such as a nonwoven fabric of glass or a woven fabric of glass. This may reduce the surface roughness of the semi-cured product 11 compared to an insulating film including a base member (i.e., a prepreg). This may reduce the chances of the surface of the sheet of metal foil 3 reflecting the surface unevenness of the semi-cured product 11, thus making it easier to reduce the diameter of the via (holes) and the width of the rewiring.

[Rewiring Layer]

A rewiring layer 100 according to this embodiment includes a cured product 12 of the insulating film 1 and a conductor pattern 105 provided on the cured product 12. The rewiring layer 100 includes the cured product 12 as an insulating layer having electrical insulation properties. In addition, the rewiring layer 100 further includes the conductor pattern 105 as rewiring. As used herein, the "rewiring" refers to wiring of a conductor, which is formed on the surface of an electronic component such as an LSI chip to connect an external electrode to a board such as a motherboard in order to transmit a signal from the electronic component to the board.

Figure 2:
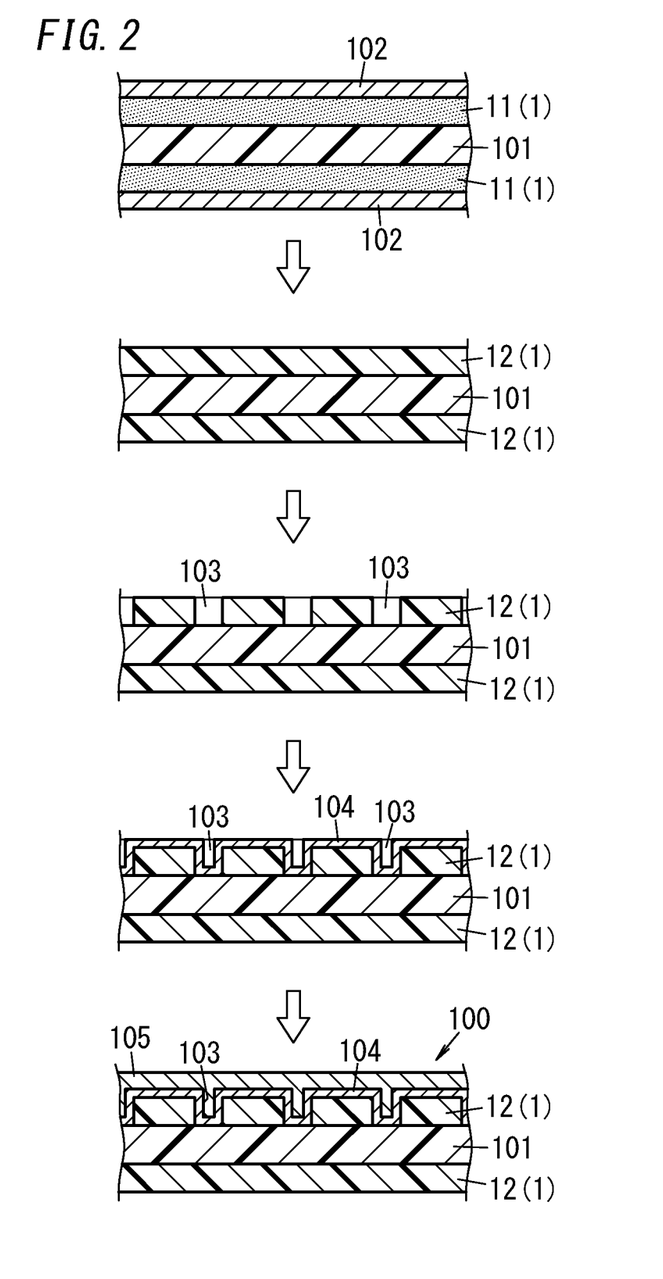
FIG. 2 shows cross-sectional views illustrating respective process steps of a method of making a rewiring layer according to the present disclosure.

FIG. 2 illustrates an exemplary manufacturing process of the rewiring layer 100. First, an insulating film 1 is provided on each of the two surfaces of a base substrate 101 and a protective film 102 is provided on the surface of each insulating film 1, thereby forming a laminate. As the base substrate 101, a silicon substrate, a resin substrate, or a glass substrate may be used, for example. Also, each insulating film 1 is formed to include the semi-cured product 11. Next, the insulating films 1 are cured by heating the laminate while applying pressure thereto, thereby forming a layer of a cured product 12 of the insulating film 1 on each of the two surfaces of the base substrate 101 and bonding the base substrate 101 and the cured products 12 together. Subsequently, the protective films 102 are peeled off and then holes (via (holes)) 103 are provided through one of the cured products 12. Each of these holes 103 is provided to extend from the surface of the cured product 12 through the surface of the base substrate 101. The holes 103 may be opened by either laser machining or drilling, for example. Next, a seed layer 104 is formed thereon. The seed layer 104 is a layer provided for the purpose of electroplating and may be formed as a thin conductive layer of a metal such as nickel or chromium. The seed layer 104 may be formed by, for example, sputtering or electroless plating. The seed layer 104 is formed to cover not only the surface of the cured product 12 either partially or entirely but also the inner surface of the holes 103. Next, an electroplating layer is formed on the surface of the seed layer 104. The conductor pattern 105 is formed out of this electroplating layer. The electroplating layer may be an electroplated copper layer, for example, and may be formed by depositing copper in the shape of a layer by electrifying the seed layer 104.

Figure 3:
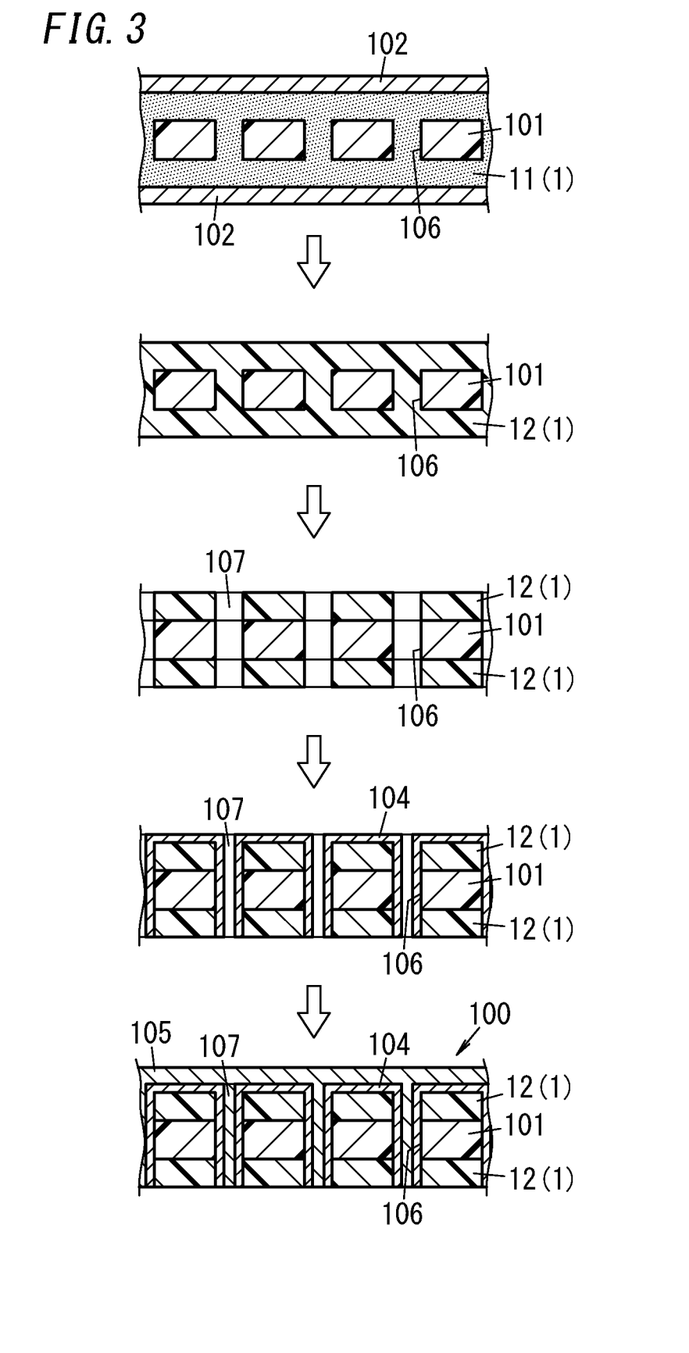
FIG. 3 shows cross-sectional views illustrating respective process steps of the method of making the rewiring layer according to the present disclosure.

FIG. 3 illustrates another exemplary manufacturing process of the rewiring layer 100. First, an insulating film 1 is provided on each of the two surfaces of a base substrate 101 and a protective film 102 is provided on the surface of each insulating film 1, thereby forming a laminate. As the base substrate 101, a silicon substrate may be used, for example, as in the example described above. In this example, a plurality of first through holes 106, each running through the thickness of the base substrate 101, are provided through the base substrate 101. The first through holes 106 are filled with a part (semi-cured product 11) of the insulating film 1. Next, the insulating films 1 are cured by heating the laminate while applying pressure thereto, thereby forming a layer of a cured product 12 of the insulating film 1 on each of the two surfaces of the base substrate 101 and bonding the base substrate 101 and the cured products 12 together. In addition, the first through holes 106 are also filled with the cured products 12. Next, a plurality of second through holes 107 are provided. Each of the second through holes 107 is provided at a position corresponding to an associated one of the first through holes 106 to run from the upper cured product 12 of the base substrate 101 through the lower cured product 12 thereof. Next, a seed layer 104 is formed thereon. The seed layer 104 may also be formed as a thin conductive layer of a metal such as nickel as in the example described above. The seed layer 104 may be formed by, for example, sputtering. The seed layer 104 is formed to cover not only the surface of the cured products 12 either partially or entirely but also the inner surface of the second through holes 107. Next, an electroplating layer is formed on the surface of the seed layer 104 in the same way as described above. The conductor pattern 105 is formed out of this electroplating layer.

Figure 4:
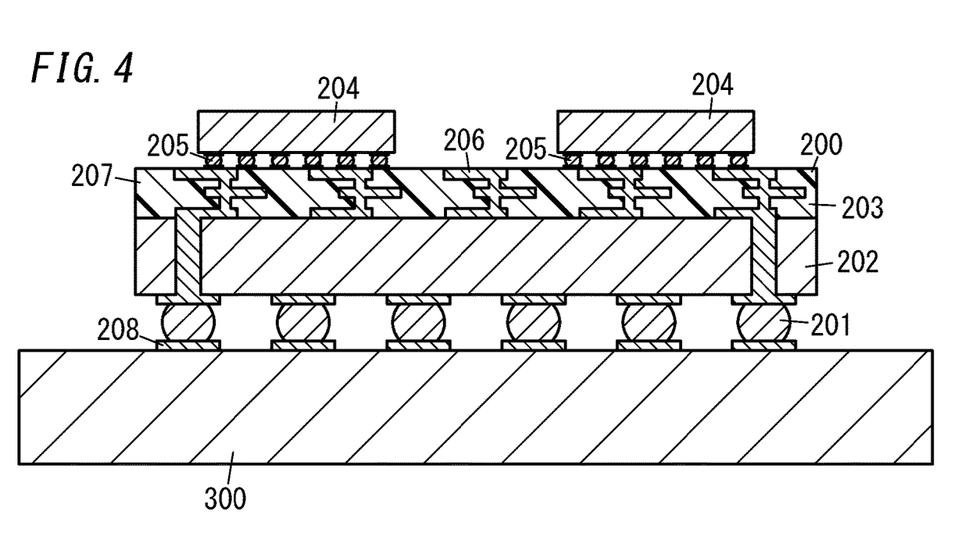
FIG. 4 is a cross-sectional view illustrating a semiconductor package including the rewiring layer according to the present disclosure.

FIG. 4 illustrates a semiconductor package 207 including a rewiring layer 200. The semiconductor package 207 is mounted on a motherboard 300. Bumps 201 are provided on the lower surface of the semiconductor package 207. The bumps 201 of the semiconductor package 207 are connected both electrically and mechanically to pads 208 on the motherboard 300. The semiconductor package 207 includes a rewiring layer 200 provided for a vertical stack of a first substrate 202 and a second substrate 203. The first substrate 202 and the second substrate 203 have rewiring 206. Each semiconductor chip 204 mounted on the second substrate 203 are connected both electrically and mechanically to the rewiring 206 via bumps 205. The bumps 201 are provided on the lower surface of the first substrate 202.

EXAMPLES

Next, the present invention will be described more specifically by way of specific examples.
<Varnish Composition>
Component (A1):
Naphthalene skeleton containing epoxy resin (HPC-9500 manufactured by DIC Corporation);
Component (A2):
Naphthalene skeleton containing phenolic resin (HPC-9500P manufactured by DIC Corporation);
Component (B):
Epoxy-modified acrylic resin (PMS-12-82 manufactured by Nagase ChemteX Corporation)
This component has structures expressed by the formulae (b1), (b2), and (b3), has no unsaturated bonds between adjacent carbon atoms, and has a weight average molecular weight of 500,000 and an epoxy value of 0.21 eq/kg.
Component (C1)
Isocyanate silane treated silica
This component is a spherical silica (SC2500GNO manufactured by Admatechs) subjected to surface treatment using 3-isocyanatepropyltriethoxy silane and has a mean particle size of 0.5 μm (=500 nm).
Component (C2)
Methacrylic silane treated silica
This component is a spherical silica (YA050C-MJE manufactured by Admatechs) subjected to surface treatment using 3-methacryloxypropyltrimethoxy silane and has a mean particle size of 50 nm.
(Solvent)
Methyl ethyl ketone
(Additive)
Phosphorus-based flame retardant (SPB-100 manufactured by Otsuka Chemical Co., Ltd.)

First and Second Examples and Comparative Example

The components (A1), (A2), and (B) were added to, and dissolved in, a solvent to have the compositions (parts by mass) shown in Table 1. Thereafter, an additive was further added to the mixture, which was compounded together. Next, the components (C1) and (C2) were added thereto and allowed to be dispersed in the mixture to prepare a varnish of a resin composition. In first and second examples and a comparative example, the components (A1) and (A2) and the component (B) were in a phase separation state without exhibiting compatibility.

Next, the resin composition in the varnish state (in Stage A state) was applied to form a film, which was heated and dried to a semi-cured state (Stage B state), thereby producing an insulating film.

Evaluation

The first and second examples and the comparative example had their thickness, surface roughness Ra, and surface roughness Rz measured by using mc2000 manufactured by Lasertec Corporation.

TABLE 1

| | | Specifics | Ex.1 | Ex.2 | Cmp |
|---|---|---|---|---|---|
| Content | Component (A1) | Naphthalene skeleton containing epoxy resin | 39 | 39 | 39 |
| | Component (A2) | Naphthalene skeleton containing phenolic resin | 31 | 31 | 31 |
| | Component (B) | Epoxy modified acrylic resin | 30 | 30 | 30 |
| | Solvent | Methyl ethyl ketone | 190 | 190 | 190 |
| | Additive | Phosphorus-based flame retardant | 19 | 19 | 19 |
| | Component (C1) | Isocyanate silane treated silica | 50 | 50 | 50 |
| | Component (C2) | Methacrylic silane treated silica | 5 | 5 | 5 |
| Evaluation | | Maximum particle size (μm) of inorganic filler | 5 | 5 | 45 |
| | | Thickness (μm) | 15 | 7 | 15 |
| | Surface roughness | Ra (nm) | 32 | 34 | 47 |
| | | Rz (nm) | 191 | 213 | 254 |

(where the unit is parts by mass)

Figure 5A:
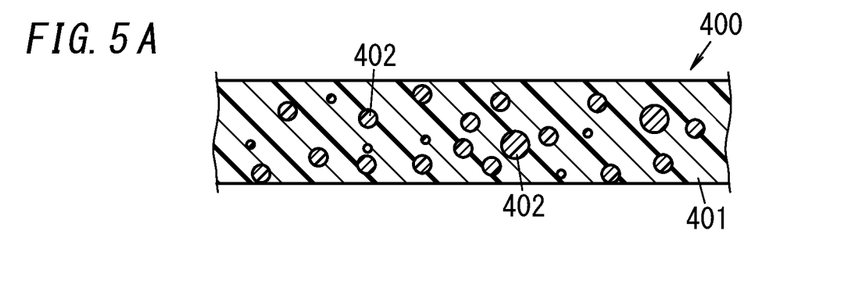
FIG. 5A schematically illustrates a cross section of an insulating film according to a first example.
Figure 5B:
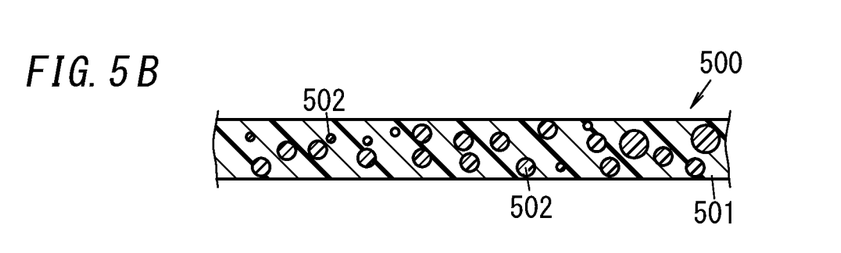
FIG. 5B schematically illustrates a cross section of an insulating film according to a second example.
Figure 5C:
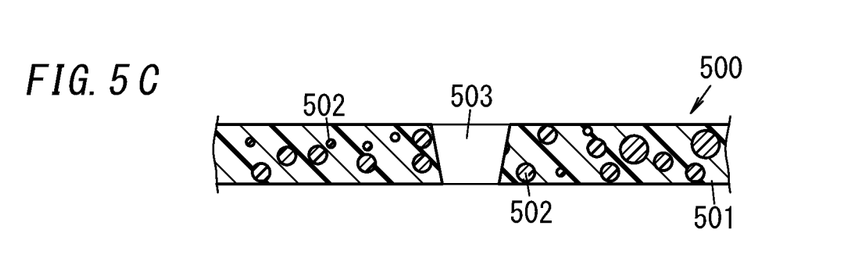
FIG. 5C schematically illustrates a cross section of an insulating film according to the second example.

FIG. 5A schematically illustrates a cross section of an insulating film 400 according to the first example. The insulating film 400 contains inorganic fillers (namely, a first inorganic filler and a second inorganic filler) 402 in a semi-cured product 401. FIG. 5B schematically illustrates a cross section of an insulating film 500 according to the second example. The insulating film 500 contains inorganic fillers (namely, a first inorganic filler and a second inorganic filler) 502 in a semi-cured product 501. The insulating film 500 according to the second example is thinner than the insulating film 400 according to the first example, thus making it easier to reduce the diameter of the hole 503 as shown in FIG. 5C. On the other hand, the surface roughness was greater in the second example than in the first example.

Figure 6A:
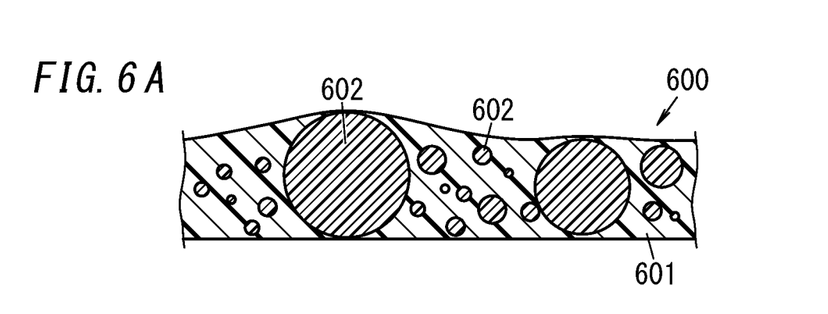
FIG. 6A schematically illustrates a cross section of an insulating film according to a third example.
Figure 6B:
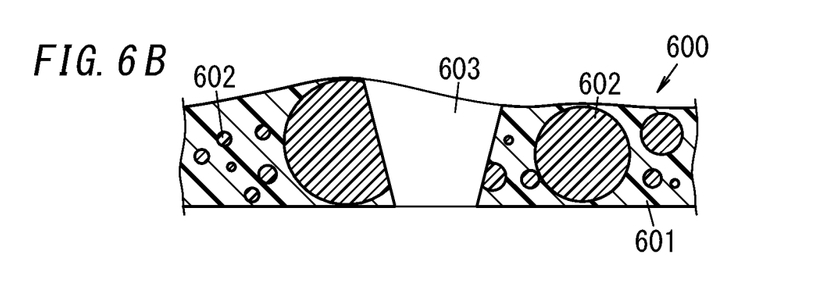
FIG. 6B schematically illustrates a cross section of an insulating film according to the third example.

FIG. 6A schematically illustrates a cross section of an insulating film 600 according to the comparative example. The insulating film 600 contains inorganic fillers (namely, a first inorganic filler and a second inorganic filler) 602 in a semi-cured product 601. The insulating film 600 according to the comparative example includes inorganic fillers having a larger maximum particle size than the insulating film 500 according to the second example. Thus, a hole 603 may be provided through a part with the inorganic filler 602 having a large particle size as shown in FIG. 6B. Thus, sometimes it may be more difficult to reduce the diameter of the hole 603 than in the second example.

REFERENCE SIGNS LIST

1 Insulating Film
11 Semi-Cured Product
12 Cured Product
2 Metal-Clad Laminate Member
100 Rewiring Layer

The invention claimed is:
1. An insulating film comprising a semi-cured product of a resin composition,
the resin composition containing: at least one of a component (A1) or a component (A2); a component (B); a component (C1); and a component (C2),
the component (A1) including an epoxy resin having at least one of a naphthalene skeleton or a biphenyl skeleton,
the component (A2) including a phenolic resin having at least one of the naphthalene skeleton or the biphenyl skeleton,
the component (B) including a high molecular weight substance having structures expressed by at least the following formulae (b2) and (b3) out of the following formulae (b1), (b2), and (b3) and having a weight average molecular weight equal to or greater than 200,000 and equal to or less than 850,000,
the component (C1) including a first filler obtained by subjecting a first inorganic filler to surface treatment using a first silane coupling agent expressed by the following formula (c1),
the component (C2) including a second filler obtained by subjecting a second inorganic filler to surface treatment using a second silane coupling agent expressed by the following formula (c2),
the insulating film containing an inorganic filler having a maximum particle size equal to or less than 5 μm,
the insulating film having a thickness equal to or greater than 0.1 μm and equal to or less than 10 μm, where x in the formula (b1), y in the formula (b2), and z in the formula (b3) satisfy the following relational expression: x:y:z (in mole fractions)=0:0.95:0.05 to 0.2:0.6:0.2 (where x+y+z≤1, 0≤x≤0.2, 0.6≤y≤0.95, and 0.05≤z≤0.2); in the formula (b2), R1 is either a hydrogen atom or a methyl group, R2 is selected from the group consisting of a hydrogen atom, an alkyl group, a glycidyl group, and an epoxidized alkyl group and at least includes either the glycidyl group or the epoxidized alkyl group; in the formula (b3), R3 is either a hydrogen atom or a methyl group and R4 is Ph (phenyl group), —COOCH$_2$Ph, or —COO(CH$_2$)$_2$Ph; in the formula (c1), R5 is either a methoxy group or an ethoxy group and R6 has an isocyanate group, a glycidyl group, or an amino group at an end of an aliphatic alkyl group having a carbon number equal to or greater than 3 and equal to or less than 18; and in the formula (c2), R7 is either a methoxy group or an ethoxy group and R8 has either a methacryloyl group or a vinyl group at an end of an aliphatic alkyl group having a carbon number equal to or greater than 3 and equal to or less than 18.

2. The insulating film of claim 1, wherein
either the component (C1) or the component (C2) is a nanofiller having a mean particle size equal to or less than 500 nm.

3. The insulating film of claim 2, wherein
content of the nanofiller falls within a range from 1 part by mass to 30 parts by mass with respect to 100 parts by mass in total of the components (A1), (A2), and (B).

4. The insulating film of claim 1, wherein
a ratio by mass of a sum of the components (A1) and (A2) to the component (B) is 90:10 to 50:50.

5. The insulating film of claim 1, wherein
combined content of the components (C1) and (C2) is equal to or less than 80% by mass with respect to an entire mass of the resin composition.

6. The insulating film of claim 1, wherein
a ratio by mass of the component (C1) to the component (C2) is 100:0 to 60:40.

7. The insulating film of claim 1, wherein
the components (A1) and (A2) and the component (B) are in a phase separation state without exhibiting compatibility.

8. The insulating film of claim 1, wherein
the component (B) has an epoxy value falling within a range from 0.01 eq/kg to 0.80 eq/kg.

9. The insulating film of claim 1, wherein
the component (B) has no unsaturated bonds between any pair of adjacent carbon atoms.

10. The insulating film of claim 1, wherein
the resin composition further contains a phosphorus-based flame retardant.

11. The insulating film of claim 1, wherein
the insulating film in a cured state has a loss modulus to storage modulus ratio equal to or greater than 0.05 in a temperature range equal to or lower than 100° C. and in a temperature range equal to or higher than 200° C.

12. A metal-clad laminate member comprising:
a semi-cured product of the insulating film of claim 1; and
a sheet of metal foil bonded to the semi-cured product.

13. A rewiring layer comprising:
a cured product of the insulating film of claim 1; and
a conductor pattern provided for the cured product.

* * * * *